United States Patent [19]

Chiang et al.

[11] Patent Number: 5,071,829
[45] Date of Patent: Dec. 10, 1991

[54] GEL METHOD FOR PREPARING HIGH PURITY BI-BASED 100K SUPERCONDUCTOR USING OXALIC ACID

[75] Inventors: Chung K. Chiang, Taipei; Cheng Y. Shei, Taipei Hsien; Yao T. Huang, Tainan Hsien, all of Taiwan

[73] Assignee: Industrial Technology Research Institute, Taiwan, Taiwan

[21] Appl. No.: 544,655

[22] Filed: Jun. 27, 1990

[51] Int. Cl.$^5$ ............................................. H01L 39/12
[52] U.S. Cl. ..................................... 505/1; 505/735; 505/737; 505/782; 252/521; 501/12; 423/593
[58] Field of Search .................... 505/1, 737, 738, 782, 505/735; 252/521; 501/12; 423/593

[56] References Cited

U.S. PATENT DOCUMENTS 4,898,851  2/1990  Michel ..................................... 505/1
4,956,340  9/1990  Kimura et al. ........................... 505/1

FOREIGN PATENT DOCUMENTS 1-197352  8/1989  Japan .

OTHER PUBLICATIONS

Slusarenko et al., "Sol-Gel Preparations and Physical Properties of the Sup. Phase $Bi_1Sr_1Ca_1Cu_2O_x$", Jrnl. Sol. St. Chem. 79, 277–281 (1989).

Clark et al., "Oxalate Precipitation Methods for Preparing the Yttrium Barium Copper Superconducting Compound", High Temp. Sup. Mat., 1988.

Pramanik, P. et al., "Preparation of Superconducting Ceramic Oxides . . . from Mixed Solvents", Prog. in High Temp. Superconductivity, vol. 16, May 2–4, 1988.

Primary Examiner—Paul Lieberman
Assistant Examiner—Bradley A. Swope
Attorney, Agent, or Firm—Scully, Scott Murphy & Presser

[57] ABSTRACT

This invention describes the way to prepare high purity Bi-based superconducting powders with the zero resistance temperature at 110K. The technique employs the dissolution of corresponding metal nitrates in deionized water, plus oxalic acid to chelate the metal cations. The amount of oxalic acid equals to about half of the total nitrate anion in molar ratio. After pH adjustment and gelation, optimal calcination results in 110K superconducting powders in high purity.

13 Claims, 5 Drawing Sheets

GEL METHOD FOR PREPARING HIGH PURITY BI-BASED 100K SUPERCONDUCTOR USING OXALIC ACID

This invention relates to a method for preparing high purity Bi-based superconducting powders with the zero resistance temperature at 110K. In particular, this invention dissolves corresponding metal nitrates plus oxalic acid for chelating agent. The amount of oxalic acid equals to half of the total nitrate anion in solution by molar ratio. The present method yields 110K superconductors via the most economical use of chemicals.

BACKGROUND OF THE INVENTION

Two known Bi-Pb-Sr-Ca-Cu-O superconducting phases have been reported with zero resistance temperatures at 80K and 110K [Maeda et al., Jpn. J. Appl. Phys. 27, L-209 (1988)]. The 80K phase has a limited application interest though prepared easily. To purify 110K phase needs more care, but it is conceivably applicable due to the high Tc above liquid nitrogen temperature (77K).

Prior techniques for preparing Bi-based superconductors include (1) solid state reaction, (2) co-precipitation and (3) sol-gel. The disadvantages of these methods are described as follows:

(1) Solid state reactions mix metal oxides or metal carbonates by manual grinding followed by heat treatment. The method requires extremely high temperature and long heating period, which result in powders with poor morphologies (low surface area, less homogeneous, etc.).

(2) Co-precipitation method has been utilized in simple ceramics. For Bi-based superconductors with multiple cations, the technique has difficulty in obtaining stoichiometric precipitates because of the solubility constant (Ksp) differences. To adjust pH value by alkali metal hydroxide (NaOH or KOH) may contaminate the solution with metal remnants. Japan Kokai JP 1197252 disclosed a method for obtaining 55K superconductors using ammonia or triethylamine for pH adjustment, which was not considered successful.

(3) Sol-gel method provides a relatively low temperature chemistry route using an organic solvent to emulsify different solid particles into semirigid gels. The common candidates for organic solvent are acetic acid, oxalic acid and citric acid. Organic solvent is a chelating agent for metal cations and will be removed by extraction or evaporation. After thermal decomposition, the dehydrated gels lead to the final produces. U-Ba-Cu-O superconductor has been prepared by the sol-gel method. However, it was considered impractical for Bi-Pb-Sr-Ca-Cu-O system because of the low solubility of bismuth salt. Japan Kokai JP 1224262 tried to dissolve bismuth salt in strong acid. Japan Kokai JP 1219004 used EDTA and ethylene glycol for chelating agents. Unfortunately, none of these prior Patents could produce pure 110K superconducting phase.

Pure 110K superconducting phase is essential in the application, such as the wire drawing and the film preparation. Several early reports experienced a zero resistance at 110K, but XRD and magnetization measurements showed only a minor amount of 110K phase [Mizuno et al., Jpn. J. Appl. Phys. 27, L-1225 (1988), Aota et al., Jpn. J. Appl. Phys. 28, L-2196 (1989), Hakuraku et al., Jpn. J. Appl. Phys. 28, L-67 (1989)]. Experimentally, we have learned that zero resistance could be achieved at 110K if there is a conducting network formed by 80K phase plus some 110K grains. In order to guarantee the physical properties after manufacturing, a high purity 110K phase must be synthesized.

SUMMARY OF THE INVENTION

Therefore, the main purpose of this invention is to provide a method for preparing high purity Bi-based 110K superconductor wherein the use of the best chelating agent is int he optimal dosage.

The other purpose of this invention is to provide a preparing method which can produce high purity Bi-based superconductor with low reaction temperature and high reaction rate.

The further purpose of this invention is to provide a method for synthesizing homogeneous 110K superconducting powders in high purity. Therefore, satisfactory results by X-ray diffraction, resistance and magnetization measurements are obtained.

In order to achieve the purposes of this invention and to eliminate the disadvantages of the prior art, the present Inventors found that the number of the functional groups contained in the chelating agent plays an important role. The amount of the chelating agent consumed has an impact on the organic decomposition, which determines a "clean" reaction. Thus, the oxalic acid with two functional groups was used as a bi-dentate ligand. Bi-dentate ligand can complex more rapidly than multi-dentate ligand, such as citric acid with four functional groups, and the complex is more stable than that formed by mono-dentate ligand, such as acetic acid with one functional group.

The preparing method of this invention includes the dissolution of nitrates of bismuth, strontium, calcium and copper in deionized water. The molar ratio of oxalic acid to total nitrate anion from the metal salts was set about one half. Ammonia, ethylene diamine and triethylamine can be used to adjust pH between 5and 8. Violent stirring results in gelation after solvent evaporation. Elevated temperature accelerates the decomposition of organic materials. Preferably, lead was used to replace bismuth by a maximum of 30 mol %. Ammonia is used to adjust pH between 6.5 and 7.0 wherein 6.7 is preferably 250° to 300° C. Calcination and sintering are carried out at 750° to 900° C., preferably 750° to 870° C. This invention is illustrated, but not limited, by the following examples.

Figure 8:
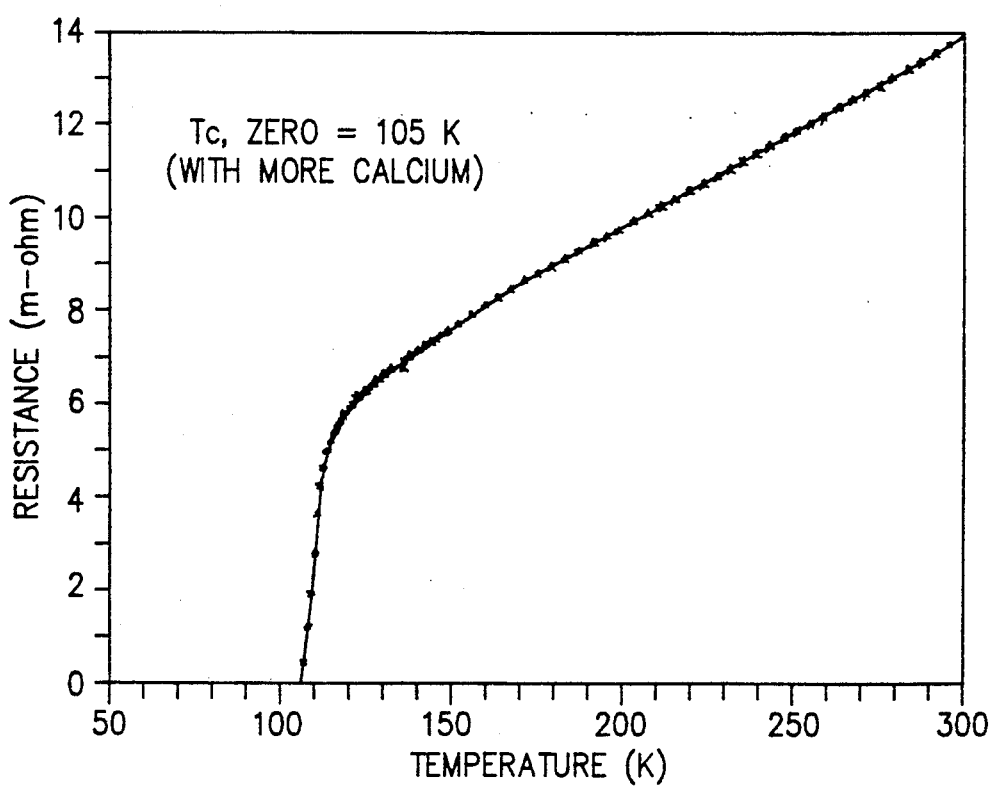
Figure 9:
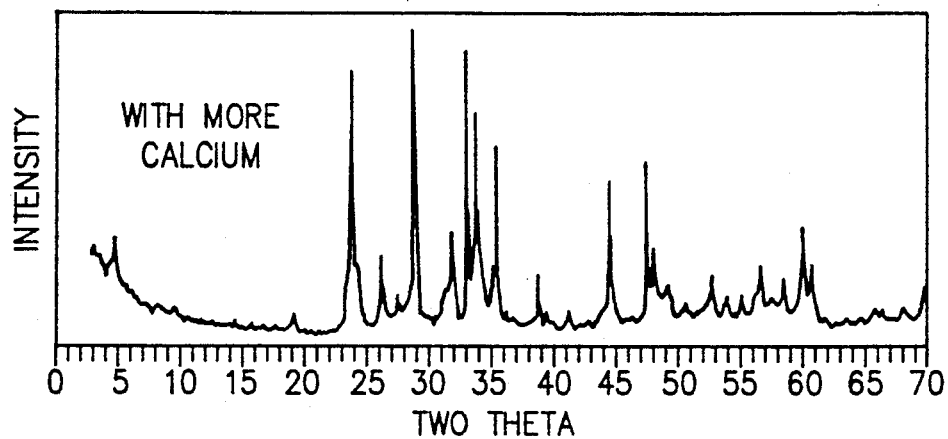

FIG. 8 is the resistivity measured by using oxalic acid as the chelating agent. The molar amount was about half of the total nitrate anion. The stoichiometry was $Bi_{1.7}Pb_{0.4}Sr_{1.6}Ca_{2.4}Cu_{3.6}O_y$;

FIG. 9 is the X-ray diffraction of the compound given in FIG. 8; and

Figure 10:
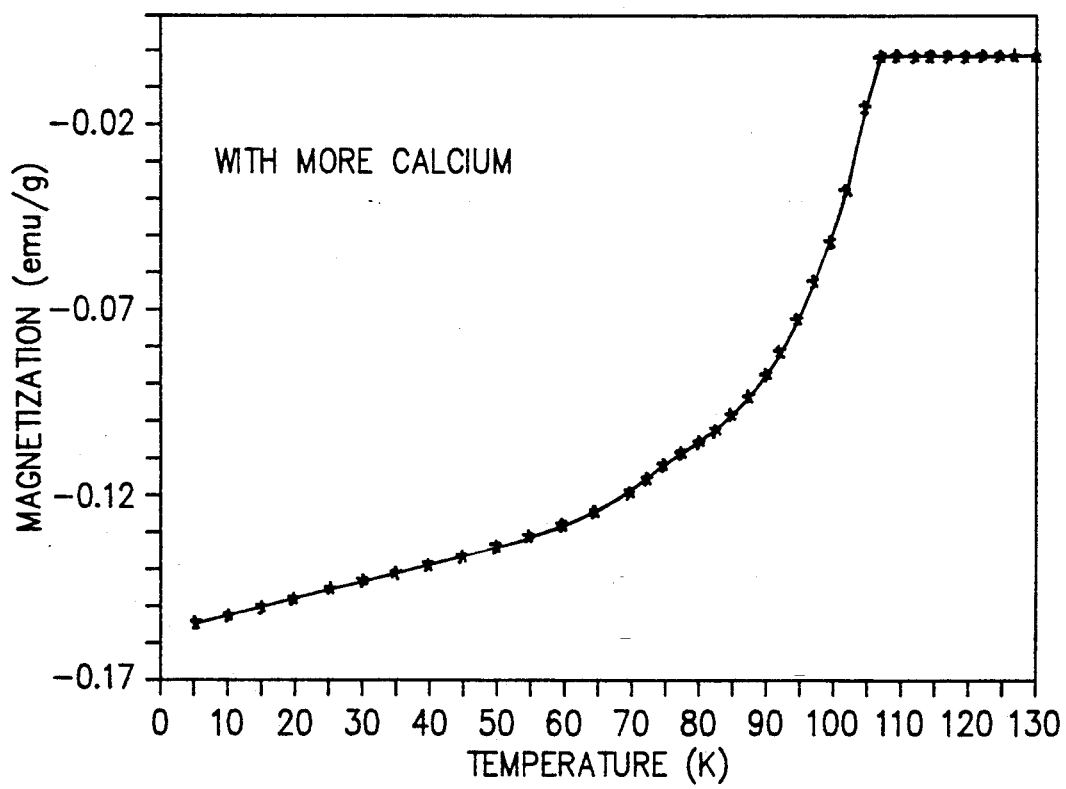

FIG. 10 is the susceptibility of the compound given in FIG. 8.

COMPARED EXAMPLE 1

Figure 1:
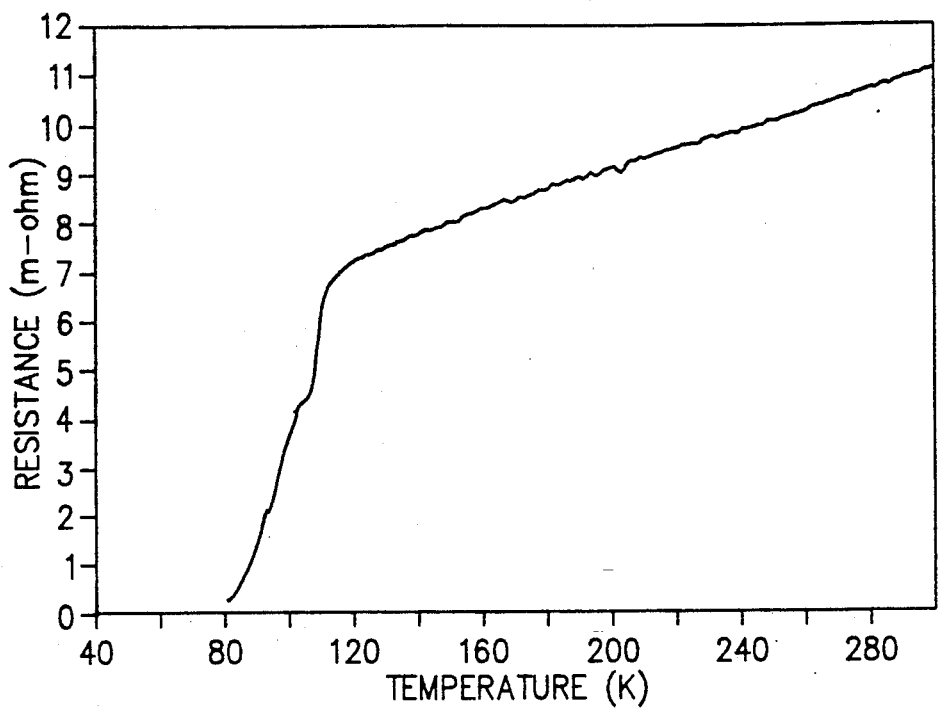
FIG. 1 is the resistivity measured by using acetic acid as the chelating agent.

The synthesis process of this example included the dissolution of $Bi(NO_3)_3.5H_2O$, $Pb(NO_3)_2$, $Sr(NO_3)_2$, $Ca(NO_3)_2.4H_2O$, and $Cu(NO_3)_2.3H_2O$ in deionized water with the composition of $(Bi_{1.4}Pb_{0.6})Sr_2Ca_2Cu_3O_y$. By stirring, bismuth salt was not completely dissolved. The metal cations were complexed by acetic acid. The solution was titrated by ammonium hydroxide solution to pH=6.7 to 6.9. After gelation, the precursor powder was calcined at 863° C. The produce obtained was displayed in FIG. 1, which was mainly an 80K phase.

COMPARED EXAMPLE 2

Figure 2:
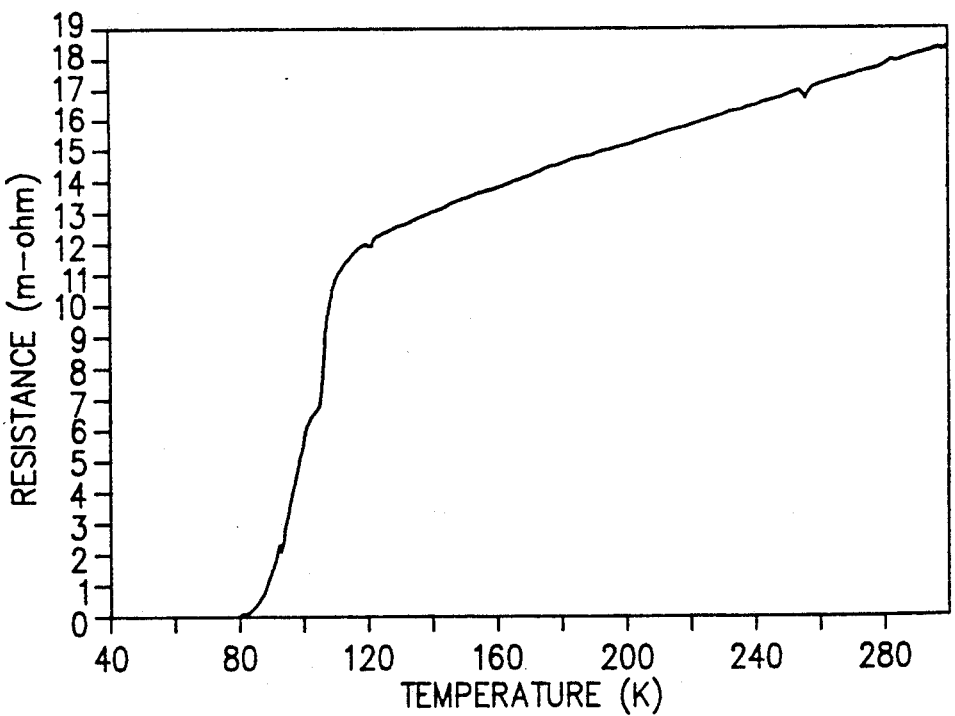
FIG. 2 is the resistivity measured by using citric acid as the chelating agent.
Figure 3:
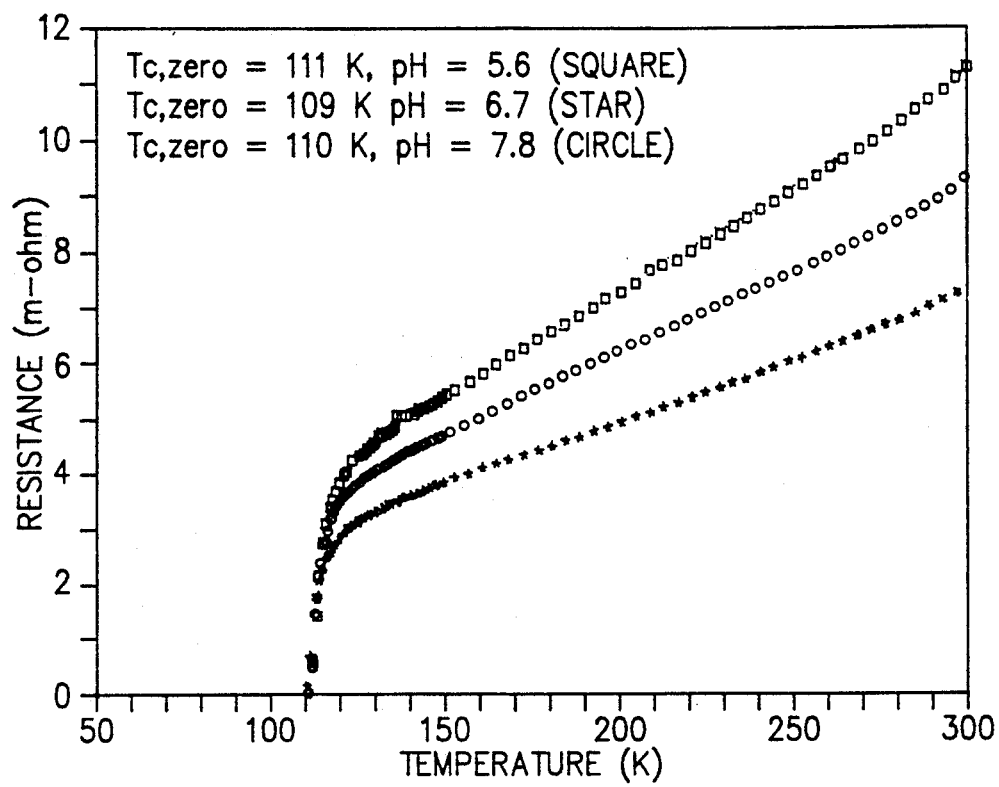
FIG. 3 is the resistivity measured by using oxalic acid as the chelating agent, wherein the molar amount thereof was about half of the total nitrate anion. The stoichiometry was $Bi_{1.4}Pb_{0.6}Sr_2Ca_2Cu_3O_y$.
Figure 4:
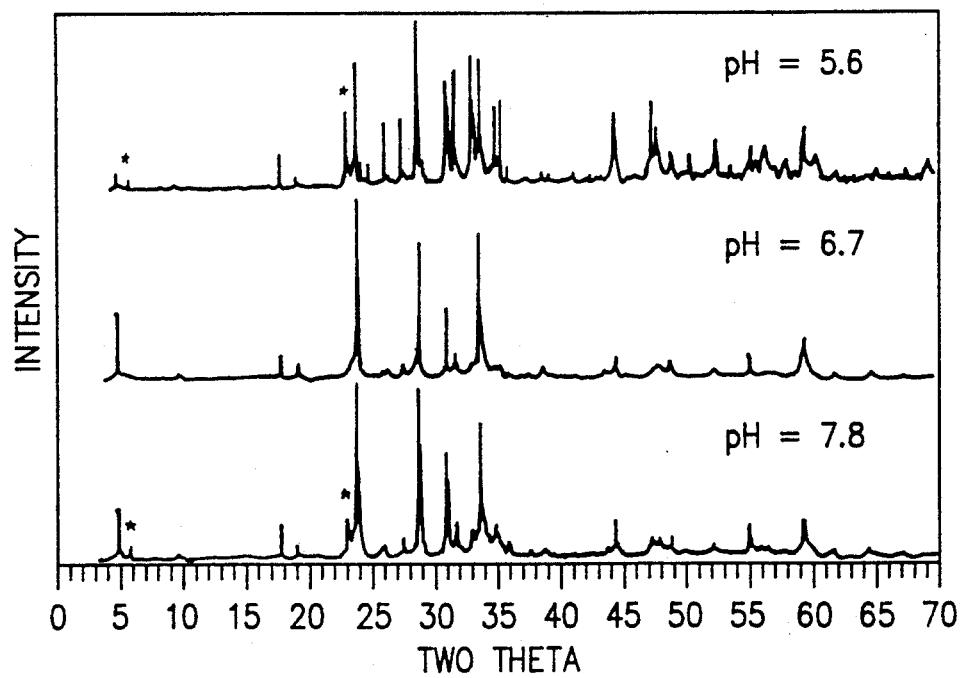
FIG. 4 is the X-ray diffraction of the compound given in FIG. 3.
Figure 5:
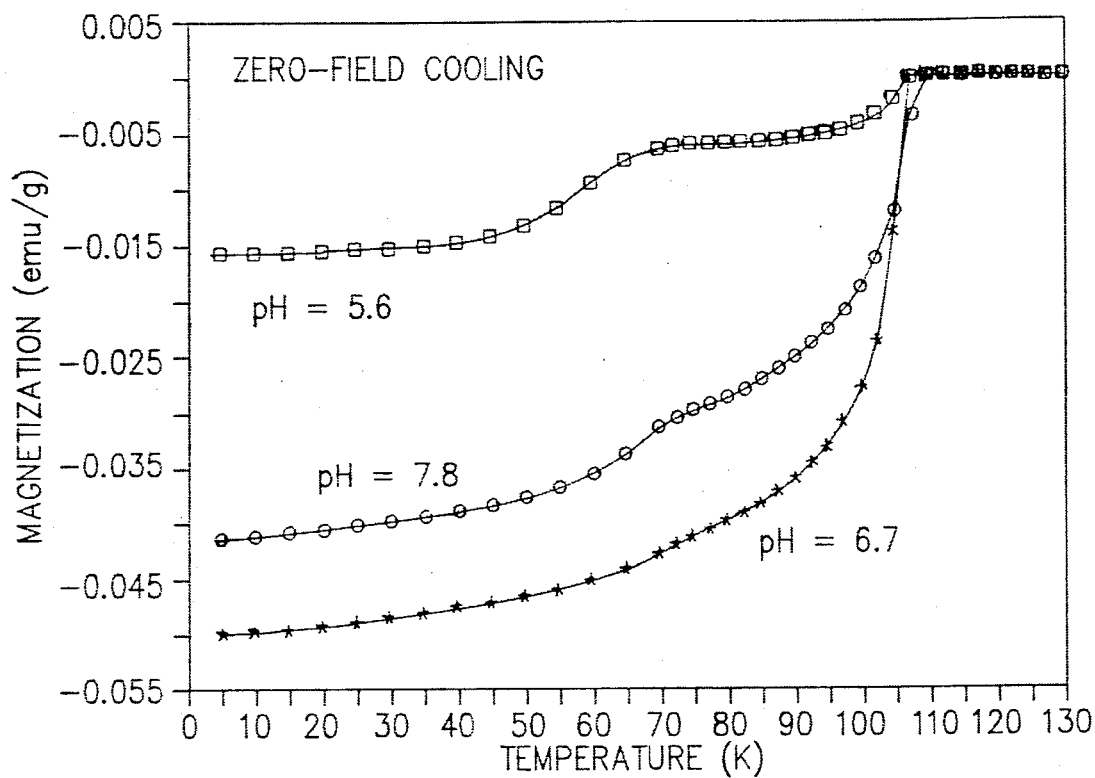
FIG. 5 is the susceptibility of the compound given in FIG. 3.
Figure 6:
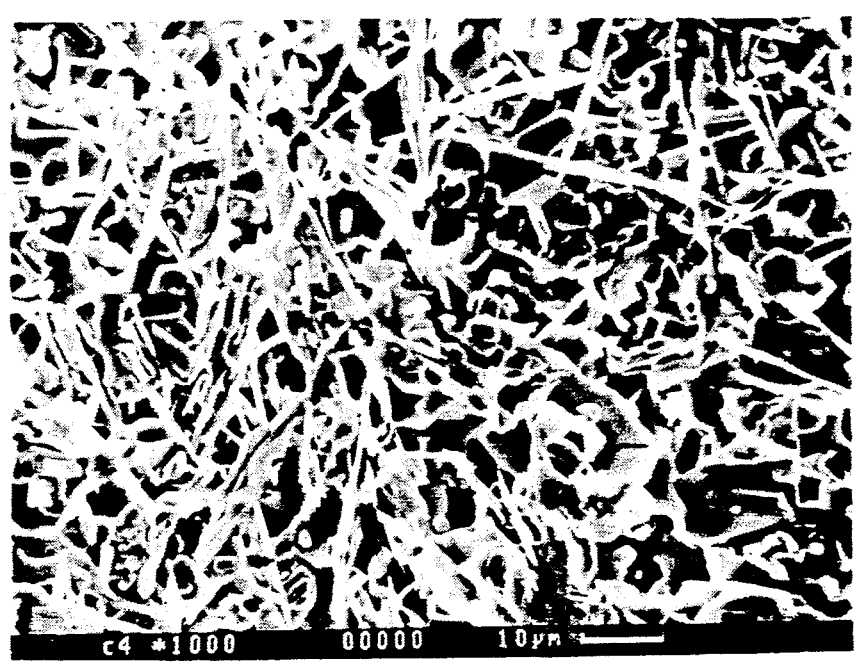
FIG. 6 is the SEM photograph of the compound given in FIG. 3.

The synthesis process was the same as the COMPARED EXAMPLE 1, except the use of citric acid for chelating agent. After gelation, the precursor powder was calcined at 860° C. The product obtained was displayed in FIG. 2, which was mainly an 80K phase.

EXAMPLE 1

The preparation process included the dissolution of $Bi(NO_3)_3.5H_2O$, $Pb(NO_3)_2$, $SR(NO_3)_2$, $Ca(NO_3)_2.4H_2O$, and $Cu(NO_3)_2.3H_2O$ in deionized water with the composition of $(Bi_{1.4}Pb_{0.6})Sr_2Ca_2Cu_3O_y$. By stirring, bismuth salt was not completely dissolved. The metal cations were complexed by oxalic acid. The molar amount of oxalic acid used was about half of the total nitrate anion in the solution. The solution was divided to three portions and each was titrated by ammonium hydroxide solution to pH=5.6, 6.7 and 7.8. The solution was then placed in an 120° C. oil bath for gelation. The gel was put into an open furnace for organic decomposition at 250° C./2 hrs and 300° C./ 1 hr. Calcination was carried at 800° C. for 12 hours in air. Powders obtained were then pelleted and air-sintered at 865° C. for 54 hours. FIGS. 3 to 6 show that pH=6.7 gives the best result in terms of the purity of the 110K phase.

COMPARED EXAMPLE 3

Figure 7:
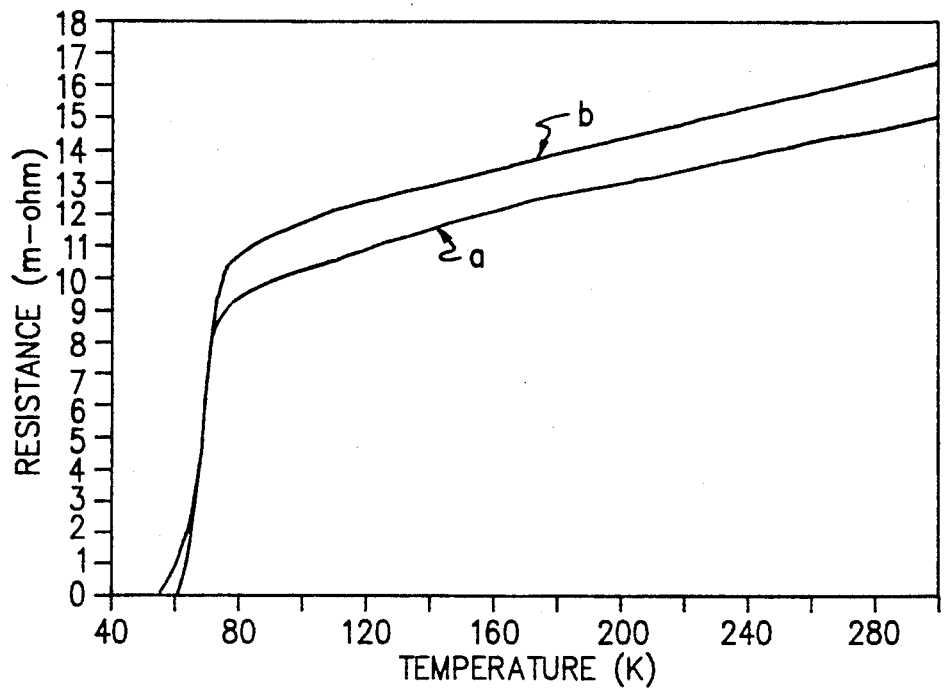
FIG. 7 is the resistivity measured by using oxalic acid in different amount as the chelating agent. The amount was (a) twice and (b) the same of the total nitrate anion.

The synthesis process used in this Example was the same as that of the Example 1, except the amount of oxalic acid was fixed at different quantities (twice and equal volume of total nitrate anion). FIG. 7 illustrates the unsuccessful results.

EXAMPLE 2

The preparation method of this invention was the same as that of Example 1, except the change in composition. The stoichiometry was enriched by calcium and copper with the formula $Bi_{1.7}Pb_{0.4}Sr_{1.6}Ca_{2.4}Cu_{3.6}O_y$. Calcination temperature was reduced to 750° C. for 12 hours. Sintering was done at 850° C. for 12 hours. Physical properties of the final product were listed in FIGS. 8 to 10. Both Examples show Bi-Pb-Sr-Ca-Cu-O 110K superconductors in high purity.

We claim:

1. A method for preparing a high purity 110K Bi-based superconductor comprising the steps of adding an aqueous solution prepared by dissolving the solid nitrates of Bi, Pb, Sr, Ca and Cu in an aqueous solution of oxalic acid, said solution being present in a substantially stoichiometric quantity relative to said nitrates so as to provide a molar oxalate ion amount equal to about half of the total nitrate anion contained in the aqueous solution:

incorporating a pH value adjusting agent to the resultant solution of the above-mentioned step to adjust the pH value thereof between 5 and 8 wherein said pH value adjusting agent is ammonia, ethylene diamine or triethylamine;

violent stirring to induce gelation;

elevating the temperature to about 200° C. to 400° C. for accelerating the decomposition of the organic materials contained; and sintering the powder obtained.

2. A method for preparing a high purity 110K Bi-based superconductor as claimed in claim 1, wherein lead is used to replace bismuth by a maximum of about 30 mol %.

3. A method for preparing a high purity 110K Bi-based superconductor as claimed in claim 1, wherein said pH value adjusting agent is ammonia.

4. A method for preparing a high purity 110K Bi-based superconductor as claimed in claim 1, wherein said pH value is adjusted between 6.5 and 7.0 by the addition of said pH value adjusting agent.

5. A method for preparing a high purity 110K Bi-based superconductor as claimed in claim 4, wherein said pH value is equal to about 6.7.

6. A method for preparing a high purity 110K Bi-based superconductor as claimed in any one of claims 1, 2, 3, 4 or 5, wherein the gelation is carried out at a temperature of about 100° to 120° C.

7. A method for preparing a high purity 110K Bi-based superconductor as claimed in claim 1, wherein the decomposition of the organic materials contained is carried out at a temperature of about 250° to 300° C.

8. A method for preparing a high purity 110K Bi-based superconductor as claimed in claim 1, wherein said sintering step is carried out at a temperature of about 750° to 900° C.

9. A method for preparing a high purity 110K Bi-based superconductor as claimed in claim 8, wherein said sintering step is carried out a temperature of about 800° to 870° C.

10. A method for preparing a high purity 110K Bi-based superconductor as claimed in claim 6, wherein the molar ratio of Ca to Sr is larger than 1.

11. A method for preparing a high purity 110K Bi-based superconductor as claimed in claim 10, wherein the molar ratio of Ca to Sr is equal to about 1.5.

12. A method for preparing a high purity 110K Bi-based superconductor as claimed in claim 10, wherein said sintering step is carried out at a temperature of about 750° to 900° C.

13. A method for preparing a high purity 110K Bi-based superconductor as claimed in claim 11, wherein said sintering step is carried out at a temperature of about 750° to 850° C.

* * * * *

UNITED STATES PATENT AND TRADEMARK OFFICE
CERTIFICATE OF CORRECTION

PATENT NO. : 5,071,829
DATED : December 10, 1991
INVENTOR(S) : Chung-Kwang Chiang, et al.

It is certified that error appears in the above-identified patent and that said Letters Patent is hereby corrected as shown below:

Column 1, line 51: "produces" should read --products--

Column 1, line 52: "U-Ba" should read --Y-Ba--

Column 2, line 11: "int he" should read --in the--

Column 2, lines 45-46: "6.7 is preferably 250° to 300°C." should read --6.7 is preferrable. Gelation can be completed at 100 to 120°C. Organic decomposition is performed at 200 to 400°C, preferrably 250 to 300°C.--

Column 3, line 17: "produce" should read --product--

Signed and Sealed this

Twentieth Day of July, 1993

Attest:

MICHAEL K. KIRK

Attesting Officer     Acting Commissioner of Patents and Trademarks